United States Patent [19]
Lee

[11] Patent Number: 6,121,667
[45] Date of Patent: Sep. 19, 2000

[54] PHOTO DIODE

[75] Inventor: Jia-Sheng Lee, Hsinchu, Taiwan

[73] Assignee: United Microelectronics Corp., Hsinchu, Taiwan

[21] Appl. No.: 09/123,670

[22] Filed: Jul. 28, 1998

[30] Foreign Application Priority Data

Jun. 8, 1998 [TW] Taiwan ................................. 87109052

[51] Int. Cl.$^7$ .................................................. H01L 31/00
[52] U.S. Cl. .......................... 257/448; 257/457; 257/459; 257/461; 257/432
[58] Field of Search .................................. 257/448, 457, 257/459, 461, 462, 432

[56] References Cited

U.S. PATENT DOCUMENTS

| | | | |
|---|---|---|---|
| 4,177,093 | 12/1979 | Feng et al. | 257/459 |
| 5,880,482 | 3/1999 | Adesida et al. | 257/459 |

*Primary Examiner*—Minh Loan Tran
*Attorney, Agent, or Firm*—Thomas, Kayden, Horstemeyer & Risley

[57] ABSTRACT

A photo diode is provided, which can polarize incident light before the light is sensed by the light-sensitive area of the photo diode so that the photo diode is capable of detecting the intensity of the light that is polarized in a specific direction. The photo diode includes a light-sensitive structure which can be a conventional photo diode, and at least one conductive grating formed over the light-sensitive structure, with the conductive grating having a plurality of substantially parallel and equally spaced conductive strips formed from a conductive material. The conductive grating can attenuate the intensity of the light that is polarized in parallel to the conductive grating before the light is sensed by the light-sensitive structure, thereby allowing only those components that are polarized in the direction perpendicular to the conductive grating to pass therethrough. The photo diode is therefore capable of detecting the intensity of the light that is polarized in a specific direction.

4 Claims, 3 Drawing Sheets

PHOTO DIODE

CROSS-REFERENCE TO RELATED APPLICATION

This application claims the priority benefit of Taiwan application serial no. 87109052, filed Jun. 8, 1998, the full disclosure of which is incorporated herein by reference.

BACKGROUND OF THE INVENTION

1. Field of the Invention

This invention relates to photo diodes, and more particularly, to a photo diode that can polarize incident light before the light is sensed by the light-sensitive areas so that the photo diode is capable of detecting the intensity of the component of the incident light that is polarized in a specific direction.

2. Description of Related Art

Two conventional photo diodes are respectively depicted in the following with reference to FIGS. 1 and 2.

As shown in FIG. 1, the first conventional photo diode is constructed on a P-type semiconductor substrate (p-sub) 100. Through various semiconductor fabrication processes, the substrate 100 is formed with a plurality of field oxide (FOX) regions 101, a gate electrode 102, an $n^+$ source/drain region 103, an $n^+$ light-sensitive area 104, and a pair of $n^-$ lightly-doped area 105.

As shown in FIG. 2, the second conventional photo diode is constructed on an N-type semiconductor substrate (n-sub) 200. Through various semiconductor fabrication processes, the substrate 200 is formed with a plurality of FOX regions 201, a $p^+$ light-sensitive area 202, and a pair of $n^+$ doped areas 203.

Both of the foregoing two types of photo diodes can be further formed with a color filter structure (not shown) over the respective light-sensitive area (i.e., the $n^+$ light-sensitive area 104 in FIG. 1 and the $p^+$ light-sensitive area 202 in FIG. 2) so as to separate the incident light into red, green, and blue (RGB) components for color detection when used in color image sensors.

One common drawback to the foregoing two types of photo diodes, however, is that they unable to polarize the incident light before it is sensed by the light-sensitive areas so that they are incapable of detecting the intensity of the light polarized in a specific direction.

SUMMARY OF THE INVENTION

It is therefore an objective of the present invention to provide a photo diode, which can polarize incident light before the light is sensed by the light-sensitive area so that the photo diode is capable of detecting the intensity of the light component that is polarized in a specific direction.

In accordance with the foregoing and other objectives of the present invention, a photo diode is provided.

In one embodiment, the photo diode of the invention comprises: a light-sensitive structure and at least one conductive grating formed over the light-sensitive structure, with the conductive grating having a plurality of substantially parallel and equally spaced conductive strips formed from a conductive material.

In another embodiment, the photo diode of the invention comprises a light-sensitive structure and a plurality of conductive gratings formed over the light-sensitive structure, with each of the conductive gratings having a plurality of substantially parallel and equally spaced conductive strips formed from a conductive material.

In still another embodiment, the photo diode of the invention comprises a semiconductor substrate, a light-sensitive structure formed in the substrate, and at least one conductive grating formed over the light-sensitive structure, with the conductive grating having a plurality of substantially parallel and equally spaced conductive strips formed from a conductive material.

In yet another embodiment, the photo diode of the invention comprises a semiconductor substrate, a light-sensitive structure formed in the substrate, and a plurality of conductive gratings formed over the light-sensitive structure, with each of the conductive gratings having a plurality of substantially parallel and equally spaced conductive strips formed from a conductive material.

In the photo diode of the invention, the conductive material is selected from the group consisting of aluminum (Al), copper (Cu), polysilicon, titanium (Ti), and titanium nitride (TiN).

The invention is characterized by the provision of at least one conductive grating over the photo diode, with the conductive grating being composed of a plurality of parallel and substantially equally spaced strips of a conductive material, which allows the light that is polarized in parallel to these conductive strips to be attenuated. The photo diode of the invention is therefore capable of detecting the intensity of the light of a particular polarization.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a photo diode that can polarize incident light before the light is sensed by the light-sensitive area so that the photo diode is capable of detecting the intensity of the light that is polarized in a particular direction. The principle utilized by the invention in the design of the photo diode is first depicted in the following with reference to FIG. 3.

Figure 3:
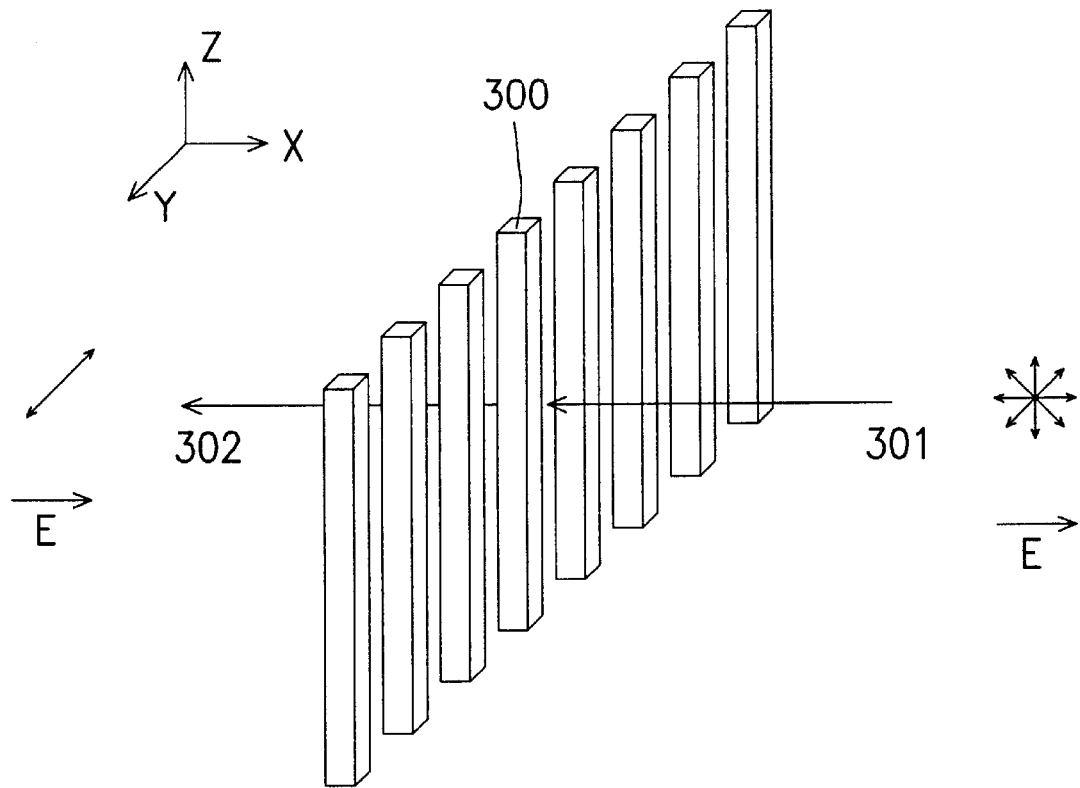
FIG. 3 is a schematic diagram used to depict the principle utilized by the photo diode according to a preferred embodiment of the invention.

FIG. 3 is a schematic diagram used to depict the polarizing effect caused by a conductive grating 300 on an incident light beam 301 passing therethrough. Assume the incident light beam 301 propagates in the X-axis direction with its wavefront lying in the Y-Z plane and being polarized in all directions in the Y-Z plane, and also assume that the conductive grating 300 is oriented in the Z-axis direction, as illustrated in FIG. 3. When passing through the conductive grating 300, all the polarized components of the incident light beam 301 in the Z-axis direction come into electromagnetic interaction with the free electrons in the parallel strips of conductive grating 300, thereby being countered by the electromagnetic fields produced by these free electrons. As a result, the emerging light beam from the conductive grating 300, as indicated by the reference numeral 302, is substantially entirely polarized in the Y-axis direction (i.e., the direction perpendicular to the parallel strips of the conductive grating 300). In other words, the emerging light beam 302 is polarized by the conductive grating 300 in one specific direction only, which is perpendicular to the parallel strips of the conductive grating 300.

Figure 4:
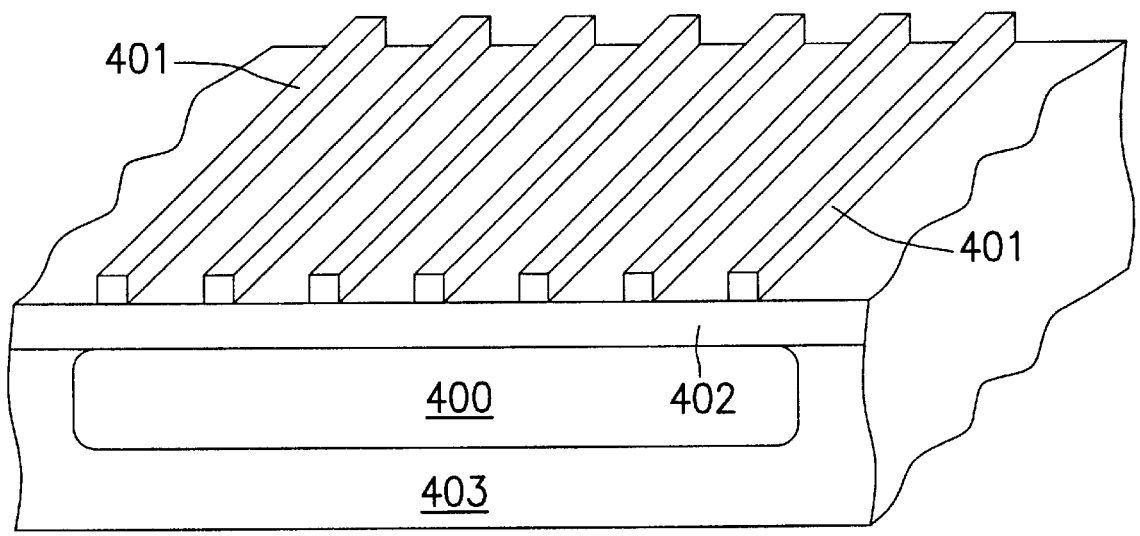
FIG. 4 is a schematic perspective diagram of the photo diode according to the embodiment of the invention.

FIG. 4 is a schematic perspective diagram of the photo diode according to the invention. As shown, the photo diode of the invention is constructed on a semiconductor substrate 403, which is further formed with a light-sensitive structure 400, an insulating layer 402 over the light-sensitive structure 400, and a conductive grating 401 over the insulating layer 402. The conductive grating 401 here is constructed in the manner described in FIG. 3.

Figure 1:
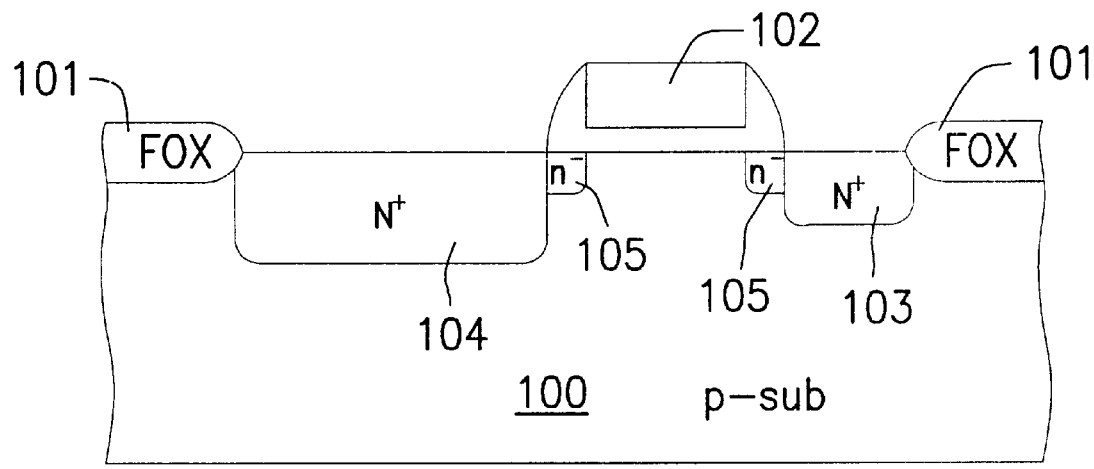
FIG. 1 is a schematic sectional diagram of a conventional photo diode.
Figure 2:
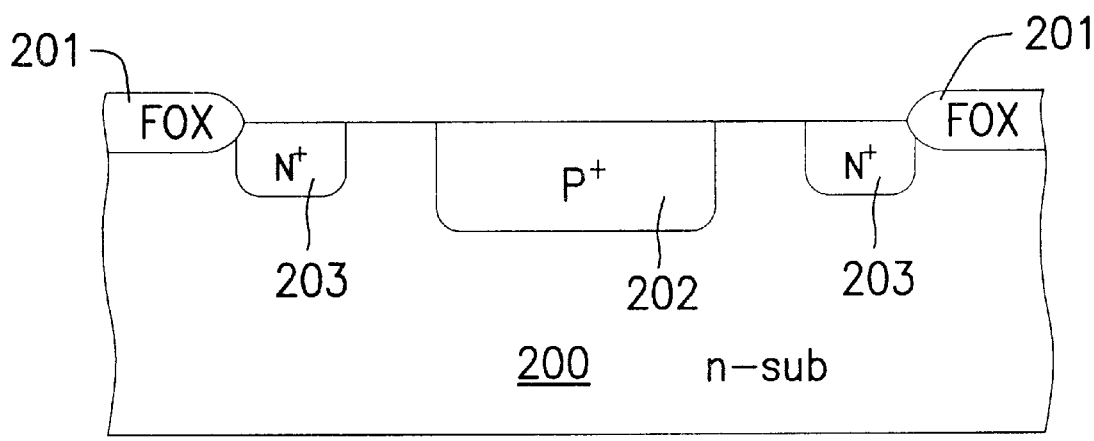
FIG. 2 is a schematic sectional diagram of another conventional photo diode.

The light-sensitive structure 400 here can be any of the two conventional photo diodes respectively shown in FIG. 1 or 2, or any other equivalent device having the same photosensitive characteristics. The construction of the light-sensitive structure 400 will therefore not be further detailed here.

The conductive grating 401 is composed of a plurality of substantially parallel and equally spaced strips of a conductive material selected from the group consisting of aluminum (Al), copper (Cu), polysilicon, titanium (Ti), and titanium nitride (TiN). The conductive grating 401 is electrically isolated by the insulating layer 402 from the underlying light-sensitive structure 400. As depicted in FIG. 3, the conductive grating 401 is capable of polarizing the incident light into a specific direction.

In the embodiment of FIG. 4, the photo diode is formed with only one conductive grating, which can attenuate up to 80% of the intensity of those light components that are polarized in the direction parallel to the conductive strips of the grating. In another embodiment, the photo diode can be formed with a plurality of conductive gratings over the light-sensitive structure so as to achieve a higher attenuation ratio to those light components.

Figure 5:
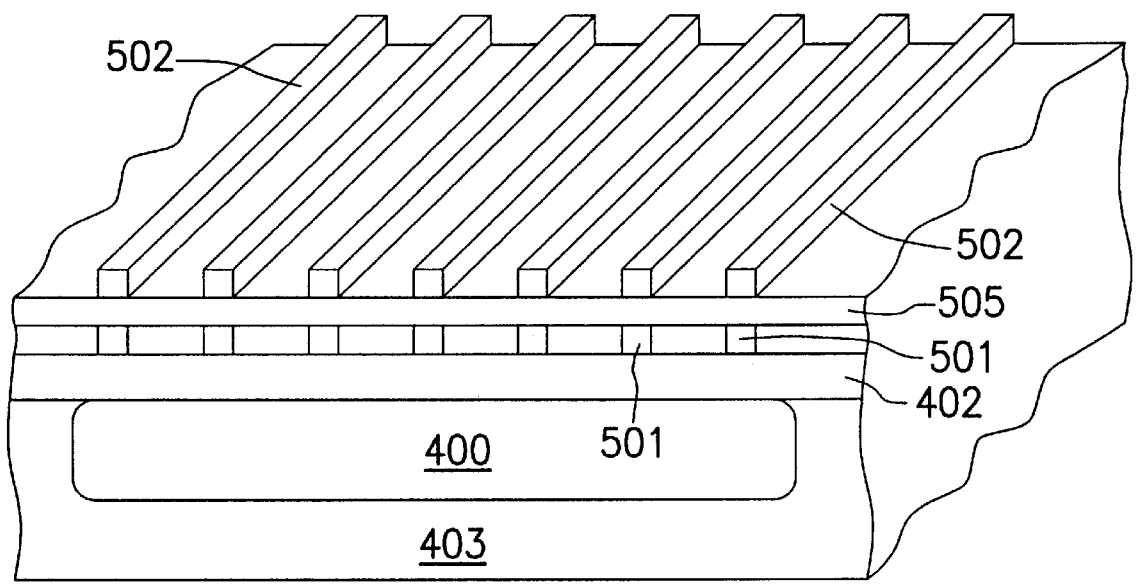
FIG. 5 is another schematic perspective diagram of the photo diode according to a embodiment of the invention.

The photo diode is characterized by the provision of at least one conductive grating over the photo diode, with the conductive grating being composed of a plurality of parallel and substantially equally spaced strips of a conductive material. For example, a conductive grating 501 and another conductive grating 502 formed over the semiconductor substrate 403, shown in FIG. 5. A dielectric layer 505 is formed between the conductive grating 501 and the conductive grating 502. The same reference numbers denotes the same elements shown in FIG. 4. It can cause the light that is polarized in the direction parallel to the conductive grating to be attenuated, thereby allowing only those components that are polarized in the direction perpendicular to the conductive grating to pass therethrough. The photo diode of the invention is therefore capable of detecting the intensity of the light that is polarized in a specific direction.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A photo diode comprising:

a semiconductor substrate;

a light-sensitive structure;

a first insulating layer disposed on the light sensitive structure; and at least one conductive grating formed over the light-sensitive structure, wherein the conductive grating has a plurality of substantially parallel and equally spaced conductive strips formed on the first insulating layer so as to be isolated from the light sensitive structure.

2. The photo diode of claim 1 further comprises a second insulating layer formed between each of the conductive gratings.

3. The photo diode of claim 1, wherein a material for the conductive strips of the conductive grating is selected from the group consisting of aluminum (Al), copper (Cu), polysilicon, titanium (Ti) and titanium nitride (TiN).

4. The photo diode of claim 1, wherein the first insulating layer is formed between the light sensitive structure and the conductive grating.

* * * * *